(12) United States Patent
Valcore, Jr. et al.

(10) Patent No.: US 9,673,026 B2
(45) Date of Patent: Jun. 6, 2017

(54) EDGE RAMPING

(71) Applicant: Lam Research Corporation, Fremont, CA (US)

(72) Inventors: John C. Valcore, Jr., Fremont, CA (US); Bradford J. Lyndaker, San Ramon, CA (US); Andrew S. Fong, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/204,702

(22) Filed: Jul. 7, 2016

(65) Prior Publication Data

US 2016/0322202 A1    Nov. 3, 2016

Related U.S. Application Data

(63) Continuation of application No. 13/659,102, filed on Oct. 24, 2012, now Pat. No. 9,408,288.

(60) Provisional application No. 61/701,547, filed on Sep. 14, 2012.

(51) Int. Cl.
*H05B 31/26* (2006.01)
*H01J 37/32* (2006.01)
*H05H 1/46* (2006.01)

(52) U.S. Cl.
CPC .. *H01J 37/32165* (2013.01); *H01J 37/32174* (2013.01); *H01J 37/32183* (2013.01); *H05H 1/46* (2013.01); *H05H 2001/4682* (2013.01)

(58) Field of Classification Search
CPC ............. H01J 37/2009; H01J 37/32082; H01J 37/32091; H01J 37/321
USPC .............. 315/111.01, 111.21, 111.41, 111.71
See application file for complete search history.

(56) References Cited

U.S. PATENT DOCUMENTS

| | | | | |
|---|---|---|---|---|
| 5,556,549 | A * | 9/1996 | Patrick | H01J 37/32082 118/712 |
| 7,375,038 | B2 * | 5/2008 | Kumar | C23F 4/00 216/12 |
| 7,967,944 | B2 * | 6/2011 | Shannon | H01J 37/32082 156/345.2 |
| 8,368,308 | B2 * | 2/2013 | Banna | H01J 37/321 315/111.71 |
| 2004/0045506 | A1 * | 3/2004 | Chen | H01J 37/32174 118/723 I |
| 2004/0107906 | A1 * | 6/2004 | Collins | H01J 37/321 118/723 I |

(Continued)

*Primary Examiner* — Jason M Crawford
(74) *Attorney, Agent, or Firm* — Martine Penilla Group, LLP

(57) ABSTRACT

Systems and methods for performing edge ramping are described. A system includes a base RF generator for generating a first RF signal. The first RF signal transitions from one state to another. The transition from one state to another of the first RF signal results in a change in plasma impedance. The system further includes a secondary RF generator for generating a second RF signal. The second RF signal transitions from one state to another to stabilize the change in the plasma impedance. The system includes a controller coupled to the secondary RF generator. The controller is used for providing parameter values to the secondary RF generator to perform edge ramping of the second RF signal when the second RF signal transitions from one state to another.

20 Claims, 11 Drawing Sheets

(56) References Cited

U.S. PATENT DOCUMENTS

| | | | | |
|---|---|---|---|---|
| 2004/0226657 | A1* | 11/2004 | Hoffman | H01J 37/32935 156/345.28 |
| 2006/0232471 | A1* | 10/2006 | Coumou | H01J 37/32082 342/450 |
| 2007/0247074 | A1* | 10/2007 | Paterson | H01J 37/32091 315/111.21 |
| 2009/0284156 | A1* | 11/2009 | Banna | H01J 37/321 315/111.21 |
| 2009/0315463 | A1* | 12/2009 | Coumou | H01J 37/32082 315/111.21 |

* cited by examiner

EDGE RAMPING

CLAIM OF PRIORITY

This application is a continuation of and claims the benefit of and priority, under 35 U.S.C. §120, to U.S. patent application Ser. No. 13/659,102, filed on Oct. 24, 2012 and titled "Edge Ramping", which claims the benefit of and priority, under 35 U.S.C. §119(e), to U.S. Provisional Patent Application No. 61/701,547, filed on Sep. 14, 2012, and titled "Edge Ramping", both of which are incorporated by reference herein in their entirety.

FIELD

The present embodiments relate to improving a response to a change in plasma impedance, and more particularly, apparatus, methods, and computer programs for performing edge ramping.

BACKGROUND

In some plasma processing systems, multiple radio frequency (RF) signals are provided to one or more electrodes within a plasma chamber. The RF signals help generate plasma within the plasma chamber. The plasma is used for a variety of operations, e.g., clean substrate placed on a lower electrode, etch the substrate, bevel etch the substrate, etc.

When there is a change in power values of one of the RF signals, plasma impedance changes and a disturbance is generated within the plasma. It is important to control the disturbance when the plasma is used for the variety of operations mentioned above.

It is in this context that embodiments described in the present disclosure arise.

SUMMARY

Embodiments of the disclosure provide apparatus, methods and computer programs for edge ramping. It should be appreciated that the present embodiments can be implemented in numerous ways, e.g., a process, an apparatus, a system, a device, or a method on a computer readable medium. Several embodiments are described below.

In an embodiment, a system includes a base RF generator for generating a first RF signal. The first RF signal transitions from one state to another. The transition from one state to another of the first RF signal results in a change in plasma impedance. The system further includes a secondary RF generator for generating a second RF signal. The second RF signal transitions from one state to another to stabilize the change in the plasma impedance. The system includes a controller coupled to the secondary RF generator. The controller is used for providing parameter values to the secondary RF generator to perform edge ramping of the second RF signal when the second RF signal transitions from one state to another.

In one embodiment, a system for reducing an effect of a change in power level of a radio frequency (RF) signal on plasma impedance is described. The system includes a primary generator. The primary generator includes a primary driver and amplifier for generating a primary RF signal and a primary digital signal processor (DSP) for identifying states of a digital pulsed signal. The states include a first state and a second state. The primary DSP is used for identifying a first primary frequency input when the digital pulsed signal is in the first state and for identifying a second primary frequency input when the digital pulsed signal is in the second state. The primary generator further includes a first primary auto frequency tuner (AFT) coupled to the primary DSP and the primary driver and amplifier. The first primary AFT is used for receiving the first primary frequency input from the primary DSP and tuning the primary RF signal to achieve plasma impedance corresponding to the first primary frequency input. The primary generator includes a second primary AFT coupled to the primary DSP and the primary driver and amplifier. The second primary AFT is used for receiving the second primary frequency input from the primary DSP and tuning the primary RF signal to achieve plasma impedance corresponding to the second primary frequency input. The primary RF signal has a primary rate of transition from the first primary frequency input to the second primary frequency input.

In this embodiment, the system further includes a secondary generator. The secondary generator includes a secondary driver and amplifier for generating a secondary RF signal and a secondary digital signal processor (DSP) for identifying the states of the digital pulsed signal. The secondary DSP is used for identifying a first secondary frequency input when the digital pulsed signal is in the first state and is used for identifying a second secondary frequency input when the digital pulsed signal is in the second state. The secondary generator further includes a first secondary AFT coupled to the secondary DSP and the secondary driver and amplifier. The first secondary AFT is used for receiving the first secondary frequency input from the secondary DSP and tuning the secondary RF signal to achieve plasma impedance corresponding to the first secondary frequency input. The secondary generator includes a second secondary AFT coupled to the secondary DSP and the secondary driver and amplifier. The second secondary AFT is used for receiving the second secondary frequency input from the secondary DSP and tuning the secondary RF signal to achieve plasma impedance corresponding to the second secondary frequency input. The secondary DSP is configured to determine a secondary rate of transition from the first secondary frequency input to the second secondary frequency input. The secondary rate of transition is different than the primary rate of transition.

In an embodiment, a system for reducing an effect of a change in power level of a radio frequency (RF) signal on plasma impedance is described. The system includes a primary generator. The primary generator includes a primary driver and amplifier for generating a primary RF signal and one or more primary controllers coupled to the primary driver and amplifier. The one or more primary controllers are configured to identify states of the digital pulsed signal. The states include a first state and a second state. The one or more primary controllers are further configured to tune the primary RF signal to achieve plasma impedance corresponding to a first primary power input when the digital pulsed signal is in the first state. Also, the one or more primary controllers are configured to tune the primary RF signal to achieve plasma impedance corresponding to a second primary power input when the digital pulsed signal is in the second state. The primary RF signal has a primary rate of transition from the first primary power input to the second primary power input.

In this embodiment, the system further includes a secondary generator. The secondary generator includes a secondary driver and amplifier for generating a secondary RF signal. The secondary generator also includes one or more secondary controllers coupled to the secondary driver and amplifier. The one or more secondary controllers are configured to tune the secondary RF signal to achieve plasma impedance corresponding to a first secondary power input when the digital pulsed signal is in the first state. The one or more secondary controllers are further configured to tune the secondary RF signal to achieve plasma impedance corresponding to a second secondary power input when the digital pulsed signal is in the second state. The one or more secondary controllers are configured to determine a secondary rate of transition from the first secondary power input to the second secondary power input. The secondary rate of transition is different than the primary rate of transition.

In one embodiment, a method for reducing an effect of a change in power level of a radio frequency (RF) signal on plasma impedance is described. The method includes identifying states of a digital pulsed signal. The states include a first state and a second state. The method includes identifying a first primary frequency input when the digital pulsed signal is in the first state and identifying a second primary frequency input when the digital pulsed signal is in the second state. The method also includes tuning a primary RF signal to achieve plasma impedance corresponding to the first primary frequency input when the digital pulsed signal is in the first state and tuning the primary RF signal to achieve plasma impedance corresponding to the second primary frequency input when the digital pulsed signal is in the second state. The primary RF signal has a primary rate of transition from the first primary frequency input to the second primary frequency input. The method includes identifying a first secondary frequency input when the digital pulsed signal is in the first state and identifying a second secondary frequency input when the digital pulsed signal is in the second state. The method further includes tuning a secondary RF signal to achieve plasma impedance corresponding to the first secondary frequency input when the digital pulsed signal is in the first state and tuning the secondary RF signal to achieve plasma impedance corresponding to the second secondary frequency input when the digital pulsed signal is in the second state. The method includes determining a secondary rate of transition from the first secondary frequency input to the second secondary frequency input. The secondary rate of transition is different than the primary rate of transition.

Some advantages of the above-described embodiments include reducing ringing or a shoot in plasma impedance when a base signal, e.g., a 2 megahertz (MHz) signal, a 27 MHz signal, etc., changes from a high power value to a low power value or the low power value to the high power value. In one embodiment, the ringing or the shoot is avoided.

In one embodiment, when the base signal changes from a first power value, e.g. the high or low power value, to a second power value, e.g., the low or high power value, another RF signal is edge ramped to control a transition of the other RF signal from a power value of the other RF signal to another power value of the other RF signal. In another embodiment, when the base signal changes from the first power value to the second power value, the other RF signal is edge ramped to control a transition of the other RF signal from a frequency value of the other RF signal to another frequency value of the other RF signal. In yet another embodiment, when the base signal changes from the first power value to the second power value, the other RF signal is edge ramped to control a transition of the other RF signal from a frequency value of the other RF signal to another frequency value of the other RF signal and to control a transition of the other RF signal from a power value of the other RF signal to another power value of the other RF signal.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for performing edge ramping. It will be apparent that the present embodiments may be practiced without some or all of these specific details. In other instances, well known process operations have not been described in detail in order not to unnecessarily obscure the present embodiments.

Figure 1:
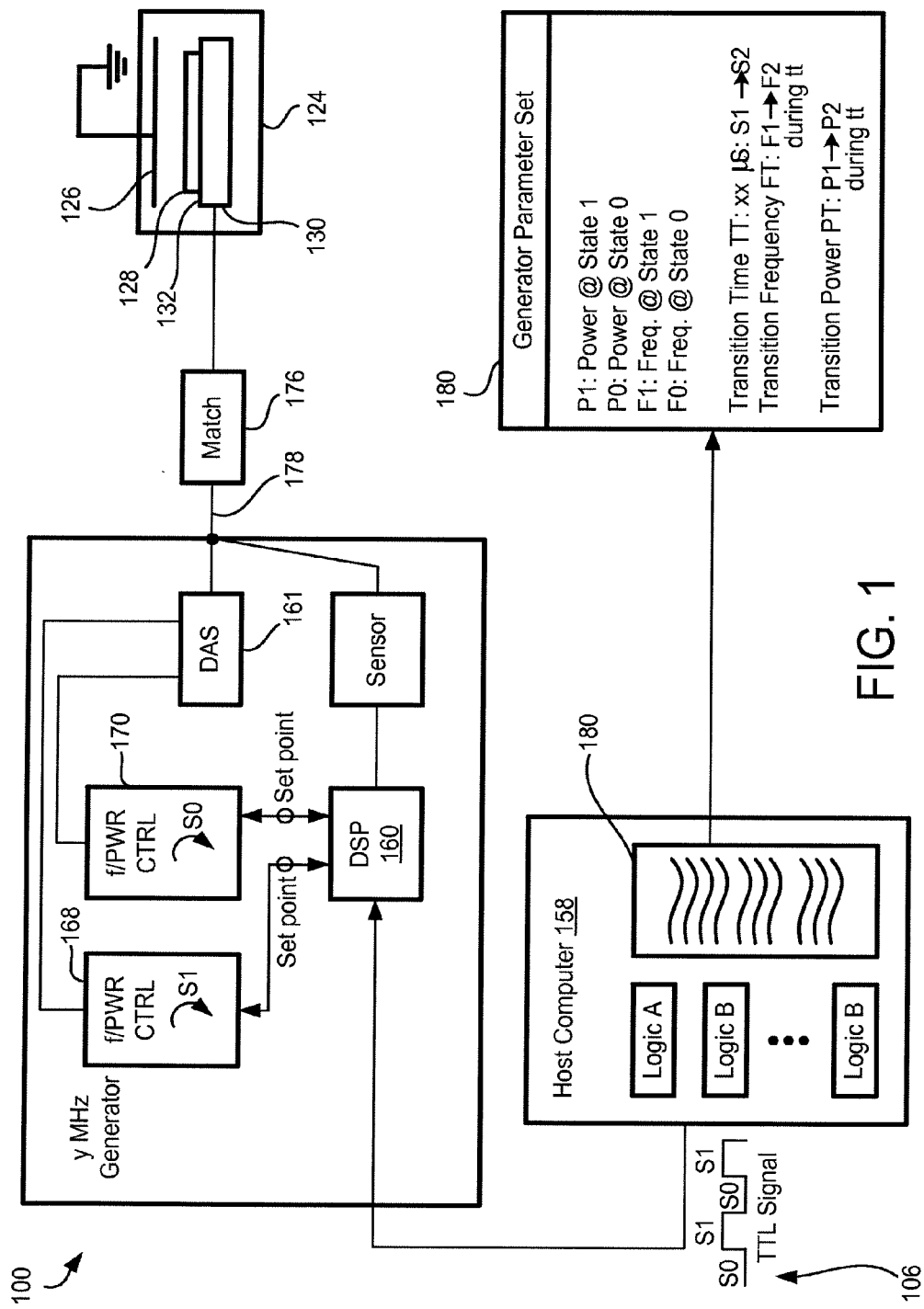
FIG. 1 is a diagram of an embodiment of a system for performing edge ramping to reduce an impact of change in plasma impedance on a dependent radio frequency (RF) signal, in accordance with an embodiment described in the present disclosure.

FIG. 1 is a diagram of an embodiment of a system 100 for performing edge ramping to reduce an impact of change in plasma impedance on a dependent radio frequency (RF) signal. A plasma chamber 124 includes a lower electrode 130, an upper electrode 126, and other components (not shown), e.g., an upper dielectric ring surrounding the upper electrode 126, an upper electrode extension surrounding the upper dielectric ring, a lower dielectric ring surrounding the lower electrode 130, a lower electrode extension surrounding the lower dielectric ring, an upper plasma exclusion zone (PEZ) ring, a lower PEZ ring, etc. The upper electrode 126 is located opposite to and facing the lower electrode 130. A substrate 128, e.g., a semiconductor wafer, is supported on an upper surface 132 of the lower electrode 130. Integrated circuits, e.g., application specific integrated circuit (ASIC), programmable logic device (PLD), etc. are developed on the substrate 128 and the integrated circuits are used in a variety of devices, e.g., cell phones, tablets, smart phones, computers, laptops, networking equipment, etc. The lower electrode 130 is made of a metal, e.g., anodized aluminum, alloy of aluminum, etc. Also, the upper electrode 126 is made of a metal, e.g., aluminum, alloy of aluminum, etc.

In one embodiment, the upper electrode 126 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 126 is grounded. The lower electrode 130 is coupled to a megahertz (MHz) RF driver and amplifier system (DAS) 161 via an impedance matching circuit 176.

When the process gas is supplied between the upper electrode 126 and the lower electrode 130 and when the DAS 161 supplies power via an impedance matching circuit 176 to the lower electrode 130, the process gas is ignited to generate plasma within the plasma chamber 124. For example, the DAS 161 supplies power via the impedance matching circuit 176 to ignite the process gas to generate plasma.

An impedance matching circuit includes electric circuit components, e.g., inductors, capacitors, etc., to match an impedance of a power source coupled to the impedance matching circuit with an impedance of a load coupled to the impedance matching circuit. For example, the impedance matching circuit 176 matches an impedance of the DAS 161 with an impedance of plasma generated within the plasma chamber 124. As yet another example, the impedance matching circuit 176 matches an impedance of the DAS 161 with an impedance of one or more portions, e.g., the plasma within the plasma chamber 124, the upper electrode 126, the lower electrode 130, other components, etc., of the plasma chamber 124. In one embodiment, an impedance matching circuit is tuned to facilitate a match between an impedance of a DAS coupled to the impedance matching circuit and an impedance of a load. An impedance match between a power source and a load reduces chances of power being reflected from the load towards the power source.

A host computer 158 is coupled to a digital signal processor (DSP) 160. The host computer 158 generates and provides a transistor-transistor logic (TTL) signal 106 to a digital signal processor (DSP) 160. The TTL signal 106 is an example of a digital pulsing signal. In one embodiment, a computer includes a TTL circuit that generates the TTL signal 106. As used herein, instead of a computer, a processor, a controller, an ASIC, or a PLD is used, and these terms are used interchangeably herein. The TTL signal 106 includes states S1 and S0. The TTL signal 106 has a 50% duty cycle. In one embodiment, the TTL signal 106 has a duty cycle ranging from 5% to 95%. An example of the state S1 includes an on state, a state having a value of 1, or a high state. An example of the state S0 includes an off state, a state having a value of 0, or a low state. The high state has a magnitude greater than the low state.

In another embodiment, instead of the computer, a clock oscillator, e.g., a crystal oscillator, is used to generate an analog clock signal, which is converted by an analog-to-digital converter into a digital signal similar to the TTL signal 106. For example, a crystal oscillator is made to oscillate in an electric field by applying a voltage to an electrode near or on the crystal oscillator.

The TTL signal 106 is sent to the DSP 160. The DSP 160 receives the TTL signal 106 and identifies the states S0 and S1 of the TTL signal 106. For example, the DSP 160 distinguishes between the states S0 and S1. As another example, the DSP 160 determines that the TTL signal 106 has a first magnitude, e.g., the value of 1, the high state magnitude, etc., during a first set of time periods and has a second magnitude, e.g., the value of 0, the low state magnitude, etc., during a second set of time periods. The DSP 160 determines that the TTL signal 106 has the state S1 during the first set of time periods and has the state S0 during the second set of time periods. As yet another example, the DSP 160 compares a magnitude of the TTL signal 106 with a pre-stored value to determine that the magnitude of the TTL signal 106 is greater than the pre-stored value during the first set of time periods and that the magnitude during the state S0 of the TTL signal 106 is not greater than the pre-stored value during the second set of time periods. In the embodiment in which the clock oscillator is used, the DSP 160 receives an analog clock signal from the clock oscillator, converts the analog signal into a digital form, and then identifies the two states S0 and S1.

When the state of the TTL signal 106 is identified as S1, the DSP 160 provides a power value P1 and/or a frequency value F1 to a frequency/power controller 168. Moreover, when the state of the TTL signal 106 is identified as S0, the DSP 160 provides a power value P0 and/or a frequency value F0 to a frequency/power controller 170. During a time of transition TT, which is ab microseconds, from the state S1 to the state S0 or the state S0 to the state S1, the DSP 160 provides one or more transition frequencies FT and/or one or more power values PT to the controller 168, where a and b are integers. In one embodiment, the power values PT range between the power values P1 and P0 and/or the frequency values FT range between the frequency values F1 and F0. In one embodiment, the DSP 160 also identifies the transition time TT as time during which neither the state S1 nor the state S0 is identified.

During the transition time TT, the controller 168 receives the transition frequencies FT and provides drive frequencies to a driver of a DAS, e.g., 2 MHz DAS, a 27 MHz DAS, a 60 MHz DAS, etc. In one embodiment, the drive frequencies are the same as the frequencies FT. The driver generates an RF signal having the drive frequencies and provides the RF signal via an amplifier, via a transmission line 178, and via an impedance matching circuit 176 to the lower electrode 130. In one embodiment, a mapping between the drive frequencies and the transition frequencies FT received from the DSP 160 are stored in a memory device of a controller that receives the drive frequencies. Examples of a member device include a random access memory (RAM) and a read-only memory (ROM). A memory device may be a flash memory, a hard disk, a storage device, a computer-readable medium, etc.

In one embodiment, a mapping between the drive frequencies and the transition frequencies FT received from the DSP 160 are stored in a memory device of a controller that receives the drive frequencies. In this embodiment, the controller maps the transition frequencies FT received from the DSP 160 to the drive frequencies to provide the drive frequencies to the driver.

Moreover, during the transition time TT, the controller 168 receives the power values PT and provides drive power values to the driver of the DAS. In one embodiment, the drive power values are the same as the power values PT. The driver generates an RF signal having the drive power values PT and provides the drive power values via the transmission line 178 and the impedance matching circuit 176 to drive lower electrode 130.

In one embodiment, a mapping between the drive power values and the transition power values PT received from the DSP 160 are stored in a memory device of a controller that receives the drive power values. In this embodiment, the controller maps the transition power values PT received from the DSP 160 to the drive power values to provide the drive power values to the driver.

The power values P1, P0, PT, a mapping between the power value P1 and the state S1, a mapping between the power value P0 and the state S0, a mapping between the power values PT and the transition time TT, the frequency values F1, F0, FT, a mapping between the frequency value F1 and the state S1, a mapping between the frequency value F0 and the state S0, a mapping between the frequency values FT and the transition time TT, or a combination thereof, is located in a generator parameter set 180, which is stored in a memory device of the host computer 158. The host computer 158 also includes logic A, B thru N to execute the generator parameter set 180. For example, the host computer 158 includes an operating system, e.g., Linux operating system, Windows™ operating system etc., and one or more programming applications, e.g., computer programs, to execute the generator parameter set 180.

In an embodiment, the power values PT, the frequency values FT, or a combination thereof are examples of parameter values.

Figure 2:
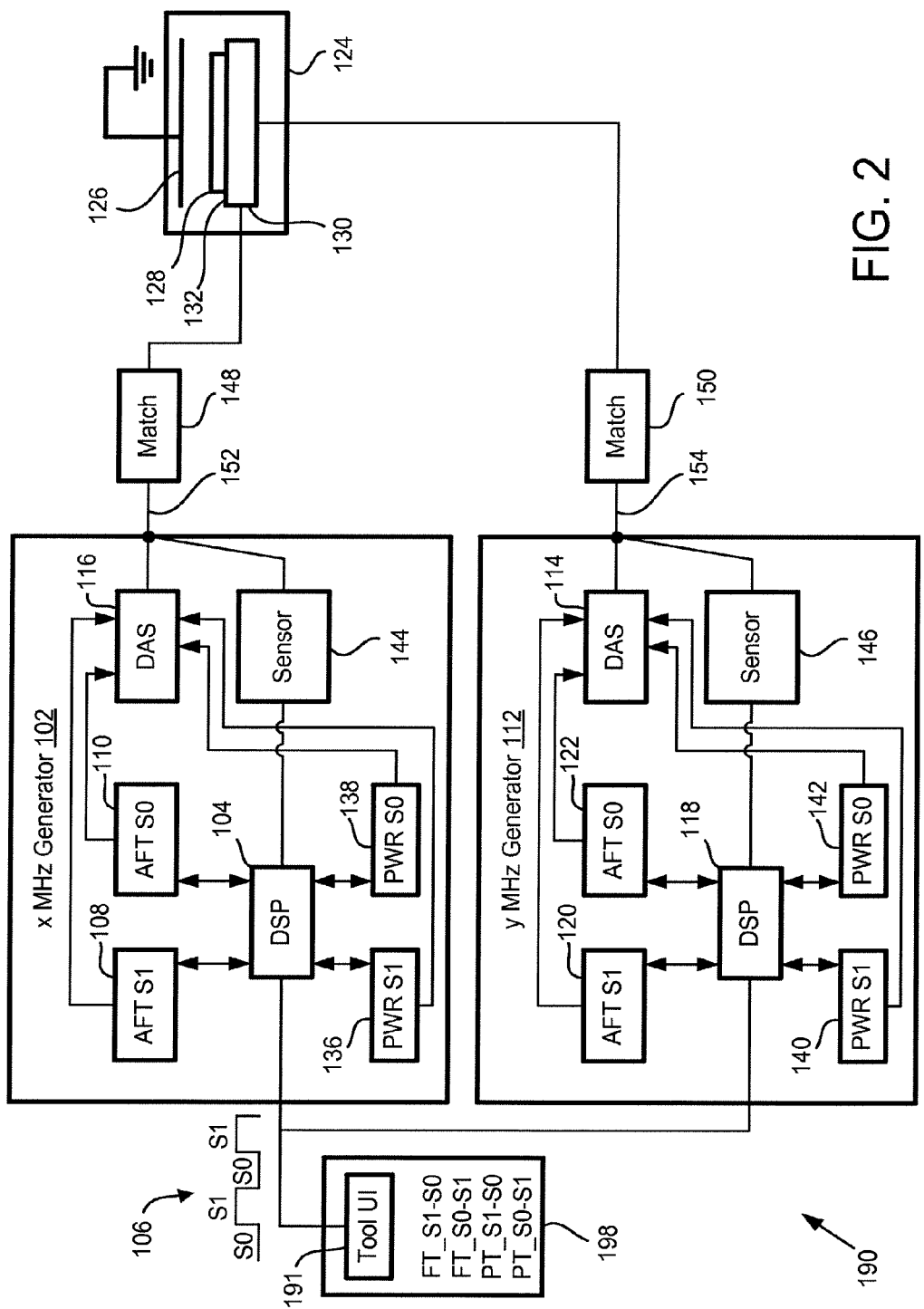
FIG. 2 is a block diagram of an embodiment of a system for performing edge ramping, in accordance with an embodiment described in the present disclosure.

FIG. 2 is a block diagram of an embodiment of a system 190 for performing edge ramping. The system 190 includes an x MHz generator 102 and a y MHz generator 112. An example of the x MHz generator 102 includes a 2 MHz generator and an example of the y MHz generator 112 includes a 60 MHz generator. Another example of the x MHz generator 102 includes a 60 MHz generator and an example of the y MHz generator 112 includes a 2 MHz generator. Yet another example of the x MHz generator 102 includes a 2 MHz generator and an example of the y MHz generator 112 includes a 27 MHz generator. Another example of x MHz generator 102 includes a 27 MHz generator and an example of the y MHz generator 112 includes a 2 MHz generator. The x MHz generator 102 is an example of a base RF generator or a primary generator and the y MHz generator 112 is an example of a secondary RF generator or a secondary generator.

The x MHz generator 102 includes a DAS 116, which generates an RF signal. Moreover, the x MHz generator 102 includes a DSP 104. The DSP 104 receives the TTL signal 106 and identifies the states of the TTL signal 106. When the state of the TTL signal 106 is S1, the DSP 104 generates a frequency value F11 and provides the frequency value F11 to an AFT 108. An example of an AFT is provided in U.S. Pat. No. 6,020,794, which is incorporated by reference herein in its entirety. In an embodiment, the terms tuner and controller are used interchangeably herein. Similarly, when the state of the TTL signal 106 is S0, the DSP 104 generates a frequency value F10 and provides the frequency value F10 to an AFT 110.

During the state S1 of the TTL signal 106, the AFT 108 that is coupled to the DSP 104 and to the DAS 116 receives the frequency value F11 from the DSP 104 and tunes, e.g., converges, frequency of an RF signal generated by the DAS 116 to achieve a pre-determined correspondence, e.g., match, a pre-determined difference, etc., between a frequency of impedance of plasma within the plasma chamber 124 and the frequency value F11. For example, the AFT 108 looks-up a drive frequency to provide to a driver of the DAS 116. The drive frequency is stored in a memory device of the AFT 108. In one embodiment, the drive frequency is the same as the frequency value F11. The drive frequency is provided by the AFT 108 to the driver of the DAS 116. The driver of the DAS 116 generates an RF signal having the drive frequency and provides the signal to an amplifier of the DAS 116. The DAS 116 generates an RF signal having the drive frequency and sends the RF signal via a transmission line 152 and via an impedance matching circuit 148 to the lower electrode 130 to drive the lower electrode 130 at the drive frequency.

The sensor 144 measures reflected power on the transmission line 152 and provides the measured reflected power to the DSP 104. The DSP 104 determines impedance of plasma within the plasma chamber 124 based on the reflected power and the impedance includes a frequency. The DSP 104 determines whether the frequency of the impedance is within a range of the frequency F11. Upon determining that the frequency is not within the range of the frequency F11, the AFT 108 looks up another drive frequency corresponding to the frequency value F11 to provide to the driver of the DAS 116. The AFT 108 continues to provide various drive frequencies that correspond to the frequency value F11 until the frequency of the impedance is within the range of the frequency F11. It should be noted that in this example, the AFT 108 stores the various drive frequencies that correspond to the frequency F11 within the storage device of the AFT 108. Similarly, during the state S0 of the TTL signal 106, the AFT 110 that is coupled to the DSP 104 and to the DAS 116 receives the frequency value F10 from the DSP 104 and tunes frequency of an RF signal generated by the DAS 116 to achieve a pre-determined correspondence between a frequency of impedance of plasma within the plasma chamber 124 and the frequency value F10.

When the TTL signal 106 transitions from the state S1 to the state S0, the frequency of the RF signal generated by the DAS 116 transitions, at a first rate, from the frequency value of F11 to the frequency value of F10. In one embodiment, the first rate is the same as that of the rate of transition of the TTL signal 106 from the state S1 to the state S0. In an embodiment, the first rate is similar, such as within def microseconds, of the rate of transition of the TTL signal 106, where each of d, e, and f is an integer. In one embodiment, the first rate is an example of a primary rate of transition.

The system 190 further includes a y MHz generator 112, which includes a DAS 114 for generating an RF signal. The y MHz generator 112 further includes a DSP 118 that identifies the states of the TTL signal 106. The DSP 118 receives the TTL signal 106 and identifies the states of the TTL signal 106. When the state of the TTL signal 106 is S1, the DSP 118 generates a frequency value F21 and provides the frequency value F21 to an AFT 120. Similarly, when the state of the TTL signal 106 is S0, the DSP 118 generates a frequency value F20 and provides the frequency value F20 to an AFT 122.

During the state S1 of the TTL signal 106, the AFT 120 that is coupled to the DSP 118 and to the DAS 114 receives the frequency value F21 from the DSP 118 and tunes, e.g., converges, frequency of an RF signal generated by the DAS 114 to achieve a pre-determined correspondence between a frequency of impedance of plasma within the plasma chamber 124 and the frequency value F21. For example, the AFT 120 looks-up a drive frequency to provide to a driver of the DAS 114. The drive frequency is stored in a memory device of the AFT 120. In one embodiment, the drive frequency is the same as the frequency value F21. The drive frequency is provided by the AFT 120 to the driver of the DAS 114. The driver generates an RF signal having the drive frequency and provides the RF signal to an amplifier of the DAS 114. The DAS 114 generates an RF signal having the drive frequency and sends the RF signal via a transmission line 154 and via an impedance matching circuit 150 to the lower electrode 130 to drive the lower electrode 130 at the drive frequency.

The sensor 146 measures reflected power on the transmission line 154 and provides the measured reflected power to the DSP 118. The DSP 118 determines impedance of plasma within the plasma chamber 124 based on the reflected power and the impedance includes a frequency. The DSP 118 determines whether the frequency of the impedance is within a range of the frequency F21. Upon determining that the frequency is not within the range of the frequency F21, the AFT 120 looks up another drive frequency corresponding to the frequency value F21 to provide to the driver of the DAS 114. The AFT 120 continues to provide various drive frequencies that correspond to the frequency value F21 until the frequency of the impedance is within the range of the frequency F21. It should be noted that in this example, the AFT 120 stores the various drive frequencies that correspond to the frequency F21 within the storage device of the AFT 120. Similarly, during the state S0 of the TTL signal 106, the AFT 122 that is coupled to the DSP 118 and to the DAS 114 receives the frequency value F20 from the DSP 118 and tunes frequency of an RF signal generated by the DAS 118 to achieve a pre-determined correspondence between a frequency of impedance of plasma within the plasma chamber 124 and the frequency value F20.

When the TTL signal 106 transitions from the state S1 to the state S0, the RF signal generated by the DAS 114 transitions, at a second rate, from the frequency value F21 to the frequency value F20. In one embodiment, the second rate is an example of a secondary rate of transition. In an embodiment, the RF signal generated by the DAS 114 transitions to stabilize plasma impedance of plasma within the plasma chamber 124. In one embodiment, the second rate is less than the first rate. For example, it takes a higher amount of time for the RF signal supplied by the DAS 114 to transition from the frequency value F21 to the frequency value F20 than that taken by the RF signal supplied by the DAS 116 from the frequency value F11 to the frequency value F10.

During the transition from the frequency value F21 to the frequency value F20, the DSP 118 provides one or more transition frequencies FT_S1-S0 to the AFT 120. The transition frequencies FT_S1-S0 are stored within a memory device of a computer 198 and received by the DSP 118 within the generator parameter set 180 from the computer 198, which is an example of the host computer 158 (FIG. 1). In one embodiment, a mapping between the transition frequencies FT_S1-S0 and the state transition from the state S1 to the state S0 is stored within a memory device of the computer 198. The AFT 120 receives the transition frequencies FT_S1-S0 and provides corresponding, e.g., mapped, etc., drive transition frequencies to the DAS 114 during the state S1 of the TTL signal 106. In one embodiment, the drive frequencies during the transition are the same as the transition frequencies FT_S1-S0. The DAS 114 generates an RF signal having the drive frequencies and provides the RF signal via the transmission line 154 and the impedance matching circuit 150 to the lower electrode 130 of the plasma chamber 124.

In an embodiment, an amount of time during which the transition frequencies FT_S1-S0 are applied is less than an amount of time taken by the impedance matching circuit 150 to match an impedance of one or more portions of plasma chamber 124 with an impedance of the DAS 114. As an example, impedance of one or more portions of the plasma chamber 124 match an impedance of the DAS 114 when a ratio of reflected power on the transmission line 154 and forward power on the transmission line 154 is close to zero, e.g., within a range from 0. The forward and reflected powers are measured by a sensor 146. The sensor 146 provides the measured values of the forward and reflected powers to the DSP 118, which converts the measured values from an analog format to a digital format and calculates the ratio.

In one embodiment, an amount of time during which the transition frequencies FT_S1-S0 are applied is less than an amount of time taken by impedance of plasma within the plasma chamber 124 to stabilize, e.g., converge, to a value. As an example, the DSP 118 determines that the plasma impedance converges to a value when the ratio is close to zero. In an embodiment, instead of the ratio, a voltage standing wave ratio (VSWR) is calculated by the DSP 118 to determine whether an amount of time during which the transition frequencies FT_S1-S0 are applied is less than an amount of time taken by the impedance matching circuit 150 to match an impedance of one or more portions of plasma chamber 124 with an impedance of the DAS 114 or to determine whether the impedance of plasma within the plasma chamber 124 is stabilized. The VSWR is calculated as being equal to a ratio of RC−1 and RC+1, where RC is a reflection coefficient.

In an embodiment, the second rate of transition occurs during a time that is less than a time of occurrence of a bandwidth of an RF transmission path, which includes the amplifier of the DAS 114, the impedance matching circuit 150, and the lower electrode 130. In one embodiment, the second rate of transition occurs during a time that is less than a time of occurrence of a width of an RF pulse of the RF signal generated by the DAS 116. The RF pulse is a portion of an RF signal when the TTL signal 106 is in the state S1 or the state S0.

Moreover, when the state of the TTL signal 106 is S1, the DSP 104 generates a power value P11 and provides the power value P11 to a power controller 136. Similarly, when the state of the TTL signal 106 is S0, the DSP 104 generates a power value P10 and provides the power value P10 to a power controller 138.

During the state S1 of the TTL signal 106, the power controller 136 that is coupled to the DSP 104 and to the DAS 116 receives the power value P11 from the DSP 104 and tunes power of an RF signal generated by the DAS 116 to achieve a corresponding impedance of plasma within the plasma chamber 124. For example, the power controller 136 looks-up a drive power value to provide to a driver of the DAS 116. The drive power value corresponds to a plasma impedance of Z1. The drive power value and the plasma impedance Z1 are stored in a memory device of the power controller 136. In one embodiment, the drive power value is the same as the power value P11. The drive power value is provided by the power controller 136 to the driver of the DAS 116. The driver generates an RF signal having the drive power value and provides the RF signal to an amplifier of the DAS 116. The amplifier may amplify the drive power value to generate an amplified power value, which may be the same as the power value of the RF signal that is received by the amplifier from the driver of the DAS 116. The RF signal having the amplified power value is supplied by the DAS 116 via the transmission line 152 and via the impedance matching circuit 148 to the lower electrode 130 to drive the lower electrode 130 at the amplified power value.

The sensor 144 measures reflected power on the transmission line 152 and provides the measured reflected power to the DSP 104. The DSP 104 determines impedance of plasma within the plasma chamber 124 based on the reflected power and the impedance includes a frequency. The DSP 104 determines the impedance based on a ratio of voltage and current, and the voltage and current are variables of power. The DSP 104 determines whether the impedance is within a range of the impedance Z1. Upon determining that the impedance is not within the range of the impedance Z1, the power controller 136 looks up another drive power value corresponding to the impedance Z1 to provide to the driver of the DAS 116. The power controller 136 continues to provide various drive power values that correspond to the impedance Z1 until the impedance determined by the DSP 104 based on the reflected power on the transmission line 152 is within the range of the impedance Z1. It should be noted that in this example, the power controller 136 stores the various drive power values that correspond to the impedance Z1 within the storage device of the power controller 136. Similarly, during the state S0 of the TTL signal 106, the power controller 138 that is coupled to the DSP 104 and to the DAS 116 receives the power value P10 from the DSP 104 and tunes power of an RF signal generated by the DAS 116 to achieve a corresponding impedance of plasma within the plasma chamber 124.

When the TTL signal 106 transitions from the state S1 to the state S0, the power value of the RF signal supplied by the DAS 116 transitions, at a third rate, from the power value of P11 to the power value of P10. In one embodiment, the third rate is the same as that of the rate of transition of the TTL signal 106 from the state S1 to the state S0. In an embodiment, the third rate is similar, such as within ghi microseconds, of the rate of transition of the TTL signal 106, where each of g, h, and i is an integer. In an embodiment, the third rate is an example of a primary rate of transition.

When the frequency value changes from F11 to F10 and/or the power value changes from P11 to P10, plasma impedance of the plasma within the plasma chamber 124 changes. Also, when the frequency value changes from F10 to F11 and/or the power value changes from P10 to P11, plasma impedance of the plasma within the plasma chamber 124 changes.

Moreover, when the state of the TTL signal 106 is S1, the DSP 118 generates a power value P21 and provides the power value P21 to a power controller 140. Similarly, when the state of the TTL signal 106 is S0, the DSP 118 generates a power value P20 and provides the power value P20 to a power controller 142.

During the state S1 of the TTL signal 106, a power controller 140 that is coupled to the DSP 118 and to the DAS 114 receives the power value P21 from the DSP 118 and tunes power of an RF signal generated by the DAS 114 to achieve a corresponding impedance of plasma within the plasma chamber 124. For example, the power controller 140 looks-up a drive power value to drive a driver of the DAS 114 at the drive power value. The drive power value corresponds to a plasma impedance of Z2. The drive power value and the plasma impedance of Z2 are stored in a memory device of the power controller 140. In one embodiment, the drive power value is the same as the power value P21. The drive power value is provided by the power controller 140 to the driver, which is coupled to an amplifier of the DAS 114 to generate an RF signal from having the drive power value. The amplifier may amplify the RF signal. In one embodiment, the amplified RF signal has the same power value as that of the RF signal that is received from the driver of the DAS 114 by the amplifier of the DAS 114. The RF signal generated by the DAS 114 is supplied via the transmission line 154 and via the impedance matching circuit 150 to the lower electrode 130 to drive the lower electrode 130 at the drive power value.

The sensor 146 measures reflected power on the transmission line 154 and provides the measured reflected power to the DSP 118. The DSP 118 determines impedance of plasma within the plasma chamber 124 based on the reflected power and the impedance includes a frequency. The DSP 118 determines whether the impedance is within a range of the impedance Z2. Upon determining that the impedance is not within the range of the impedance Z2, the power controller 140 looks up another drive power value corresponding to the impedance Z2 to provide to the driver of the DAS 114. The power controller 140 continues to provide various drive power values that correspond to the impedance Z2 until the impedance determined by the DSP 118 based on the reflected power on the transmission line 154 is within the range of the impedance Z2. It should be noted that in this example, the power controller 140 stores the various drive power values that correspond to the impedance Z2 within the storage device of the power controller 140. Similarly, during the state S0 of the TTL signal 106, the power controller 142 that is coupled to the DSP 118 and to the DAS 114 receives the power value P20 from the DSP 118 and tunes power of an RF signal generated by the DAS 114 to achieve a corresponding impedance of plasma within the plasma chamber 124.

When the TTL signal 106 transitions from the state S1 to the state S0, the RF signal generated by the DAS 114 transitions, at a fourth rate, from the power value P21 to the power value P20. In one embodiment, the fourth rate is less than the third rate. For example, it takes a higher amount of time for the RF signal supplied by the DAS 114 to transition from the power value P21 to the power value P20 than that taken by the RF signal supplied by the DAS 116 to transition from the power value P11 to the power value P10. In an embodiment, the fourth rate is an example of a secondary rate of transition.

During the transition from the power value P21 to the power value P20, the DSP 118 provides one or more transition power values PT_S1-S0 to the power controller 140. The transition power values PT_S1-S0 are stored within a memory device of the computer 198 and received within the generator parameter set 180 by the DSP 118. In one embodiment, a mapping between the transition power values PT_S1-S0 and the state transition from the state S1 to the state S0 is stored within a memory device of the computer 198. The power controller 140 receives the transition power values PT_S1-S0 and provides drive transition power values to the DAS 114 during the transition from the power value P21 to the power value P20. The DAS 114 generates an RF signal having the transition power values PT_S1-S0 and provides the RF signal via the transmission line 154 and the impedance matching circuit 150 to the plasma chamber 124.

In an embodiment, an amount of time during which the transition power values PT_S1-S0 are applied is less than an amount of time taken by the impedance matching circuit 150 to match an impedance of one or more portions of plasma chamber 124 with an impedance of the DAS 114. As an example, impedance of one or more portions of the plasma chamber 124 match an impedance of the DAS 114 when a ratio of reflected power on the transmission line 154 and forward power on the transmission line 154 is close to zero, e.g., within a range from 0.

In one embodiment, an amount of time during which the transition power values PT_S1-S0 are applied is less than an amount of time taken by impedance of plasma within the plasma chamber 124 to stabilize, e.g., converge to a value. In an embodiment, instead of the ratio, a VSWR is calculated by the DSP 118 to determine whether an amount of time during which the transition power values PT_S1-S0 are applied is less than an amount of time taken by the impedance matching circuit 150 to match an impedance of one or more portions of plasma chamber 124 with an impedance of the DAS 114 or to determine whether the impedance of plasma within the plasma chamber 124 is stabilized.

In an embodiment, the fourth rate of transition occurs during a time that is less than a time associated with occurrence of a bandwidth of an RF transmission path, which includes the amplifier of the DAS 114, the impedance matching circuit 150, and the lower electrode 130. In one embodiment, the fourth rate of transition occurs during a time that is less than a time of occurrence of a width of an RF pulse of the RF signal generated by the DAS 116.

In one embodiment, both the transition frequency values FT_S1-S0 and the transition power values PT_S1-S0 are provided by the DSP 118 simultaneously or substantially at the same time to the power controller 140 and the AFT 120. In this embodiment, the DSP 118 provides the transition power values PT_S1-S0 to the power controller 140 and provides the frequency values FT_S1-S0 to the AFT 120. An example of substantially the same time is within a predetermined time period, e.g., a number of microseconds, of providing the transition power values PT_S1-S0 or the transition frequency values FT_S1-S0.

Although the above embodiments are described with respect to transition from the state S1 to the state S0, in one embodiment, the embodiments are modified to apply to a transition from the state S0 to the state S1. For example, during the transition from the state S0 to S1 of the TTL signal 106, same or different set of transition frequency values, e.g., FT_S0-S1, may be used compared to the transition frequency values FT_S1-S0. In this example, the transition frequency values FT_S0-S1 are provided to the AFT 122 by the DSP 118 instead of to the AFT 120. As another example, during the transition from the state S0 to S1, same or different set of transition power values, e.g., PT_S0-S1, may be used compared to the transition power values PT_S1-S0. In this example, the transition power values PT_S0-S1 are provided to the power controller 142 by the DSP 118 instead of the power controller 140. Also, as another example, during the transition from the state S0 to the state S1, the same or different set of transition frequency values and the same or different set of transition power values are provided simultaneously or substantially at the same time. For example, the transition frequency values FT_S0-S1 are provided by the DSP 118 to the AFT 122 simultaneous with provision of transition power values PT_S1-S0 from the DSP 118 to the power controller 142.

In an embodiment, the functions performed by the DSP 118 can be performed by an AFT or a power controller. For example, instead of the DSP 118 determining which transition frequency values to apply based on whether a state transition is from the state S1 to the state S0 or from the state S0 to the state S1, the AFT 120 or the AFT 122 determines which transition frequency values to apply based on whether the state transition is from the state S1 to the state S0 or from the state S0 to the state S1. As another example, instead of the DSP 118 providing the transition power values to a power controller, the power controller receives a determination from the DSP 118 that a state is transitioning. Upon receiving the determination, the power controller retrieves transition power values from a memory device of the power controller and provides the transition power values to the DAS 114. As yet another example, instead of the DSP 118 providing the transition frequency values to an AFT, the AFT receives a determination from the DSP 118 that a state is transitioning. Upon receiving the determination, the AFT retrieves transition frequency values from a memory device of the AFT and provides the transition frequency values to the DAS 114.

In one embodiment, an AFT and/or a power controller of a generator is included within a DSP of the generator. For example, the AFTs 120 and 122 and the power controllers 140 and 142 are included within the DSP 118.

In one embodiment, a single controller is used instead of the power controller 140 and the AFT 120, a single controller is used instead of the power controller 142 and the AFT 122, a single controller is used instead of the power controller 136 and the AFT 108, and/or a single controller is used instead of the power controller 138 and the AFT 110.

In the embodiment in which an additional DAS is used in addition to using the DASs 114 and 116, a z MHz generator is similar to the y MHz generator 112 except that the z MHz generator includes a z MHz DAS instead of the DAS 114. The z MHz generator is coupled to the lower electrode 130 of the plasma chamber 124 via an impedance matching circuit (not shown) and a transmission line (not shown). Moreover, the z MHz DAS is coupled with the Tool UI 191 to receive the TTL signal 106. The z MHz generator includes two power controllers, two AFTs, a DSP, an ADC, a sensor, and the z MHz DAS. An example of z MHz is 27 MHz. Another example of z MHz is 30 MHz.

In an embodiment, the one or more transition frequencies FT_S1-S0, the one or more transition frequencies FT_S0-S1, the one or more transition power values PT_S1-S0, the one or more transition power values PT_S0-S1, or a combination thereof are examples of parameter values.

In one embodiment, the DAS 116 is an example of a primary driver and amplifier, the DSP 104 is an example of a primary DSP, the AFT 108 is an example of a first primary AFT, and the AFT 110 is an example of a second primary AFT. Moreover, in an embodiment, the DSP 118 is an example of a secondary DSP, the AFT 120 is an example of a first secondary AFT, and the AFT 122 is an example of a second secondary AFT.

Also, in an embodiment, the frequency value F11 is an example of a first primary frequency input, the frequency value F10 is an example of a second primary frequency input, the power value P11 is an example of a first primary power input, and the power value P10 is an example of a second primary power input. Moreover, in one embodiment, the frequency value F10 is an example of a first primary frequency input, the frequency value F11 is an example of a second primary frequency input, the power value P10 is an example of a first primary power input, and the power value P11 is an example of a second primary power input.

Moreover, in one embodiment, the frequency value F21 is an example of a first secondary frequency input, the frequency value F20 is an example of a second secondary frequency input, the power value P21 is an example of a first secondary power input, and the power value P20 is an example of a second secondary power input. Furthermore, in an embodiment, the frequency value F20 is an example of a first secondary frequency input, the frequency value F21 is an example of a second secondary frequency input, the power value P20 is an example of a first secondary power input, and the power value P21 is an example of a second secondary power input.

In an embodiment, one or more primary controllers are controllers within the x MHz generator 102 and one or more secondary controllers are controllers within the y MHz generator 112. In one embodiment, a primary RF signal is an RF signal generated by the DAS 116 of the x MHz generator 102 to be sent via the transmission line 152 to the plasma chamber 124 and a secondary RF signal is a signal generated by the DAS 114 of the y MHz generator 112 to be sent via the transmission line 154 to the plasma chamber 124.

In an embodiment, instead of a controller or a tuner, a control logic block, e.g., a computer program, that is executed by a processor is used. For example, each AFT of a generator is a logic block that is executed by a processor of the generator. As another example, each power controller of a generator is a logic block that is executed by a processor of the generator. A computer program is embodied in a non-transitory computer-readable medium, examples of which are provided below.

Figure 3:
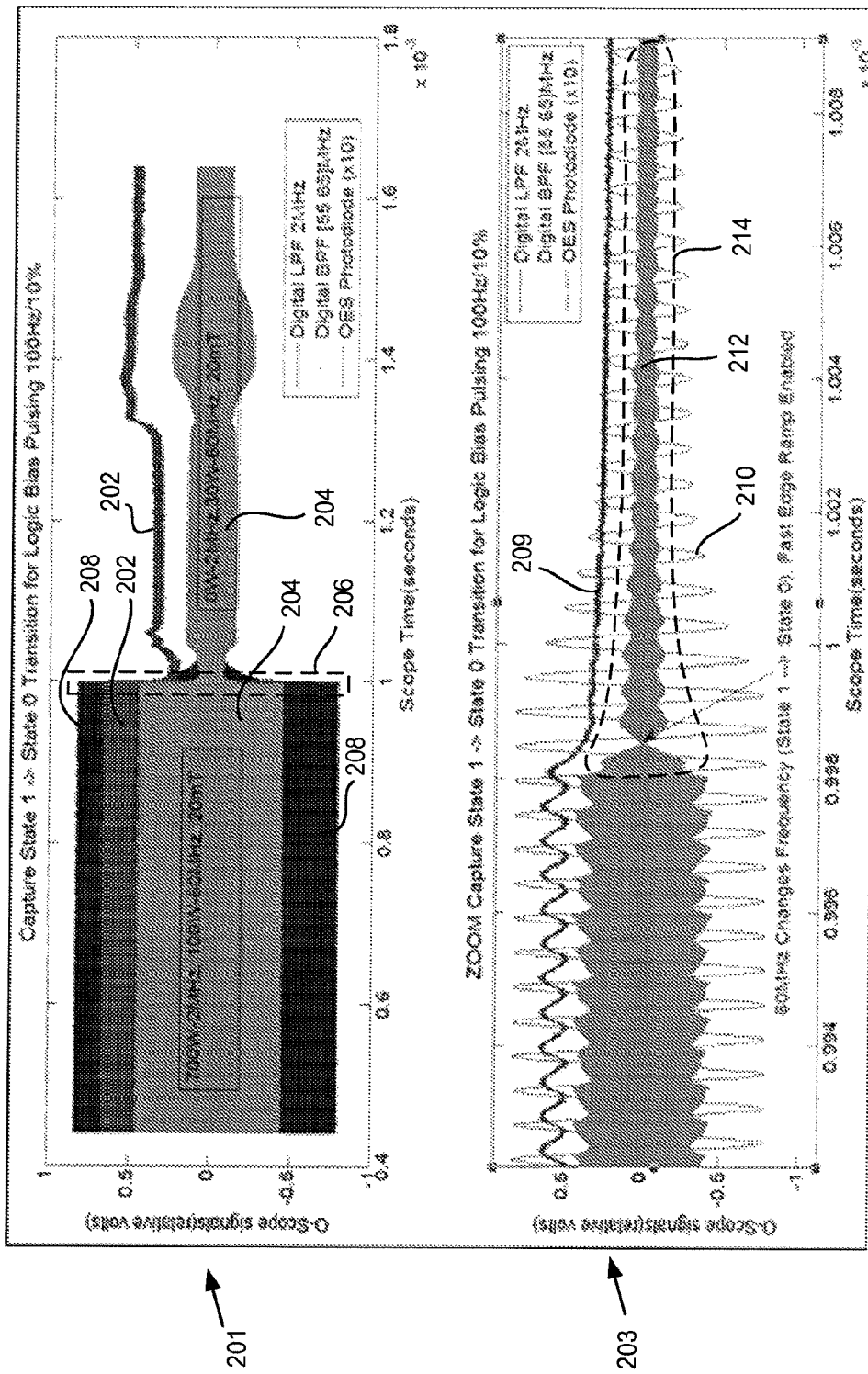
FIG. 3 shows embodiments of graphs to illustrate a time period during which edge ramping may be performed, in accordance with an embodiment described in the present disclosure.

FIG. 3 shows embodiments of graphs 201 and 203 to illustrate a time period during which edge ramping may be performed. Graph 201 plots voltage of signals versus time. A plot 202 shows change in voltage of plasma within the chamber 124 with respect to time. A plot 204 shows change in a voltage of a 60 MHz RF signal with respect to time and a plot 208 shows change in a voltage of a 2 MHz RF signal with respect to time. During occurrence of a portion 206 when the 2 MHz RF signal transition from a high power value to a low power value, edge ramping may be performed. The high power value is higher than the low power value.

The graph 203 is a zoom in of the portion 206. In the graph 203, a plot 209 shows change in voltage of plasma within the chamber 124 with respect to time. A plot 212 shows change in a voltage of the 60 MHz RF signal with respect to time and a plot 210 shows change in a voltage of the 2 MHz RF signal with respect to time. Edge ramping of the 60 MHz signal may be performed during a time period illustrated within a portion 214 of the graph 203. When edge ramping is performed, eventually, the 2 MHz signal achieves the low power value and the 60 MHz signal is still is in transition between its high power value and its low power value.

Figure 4:
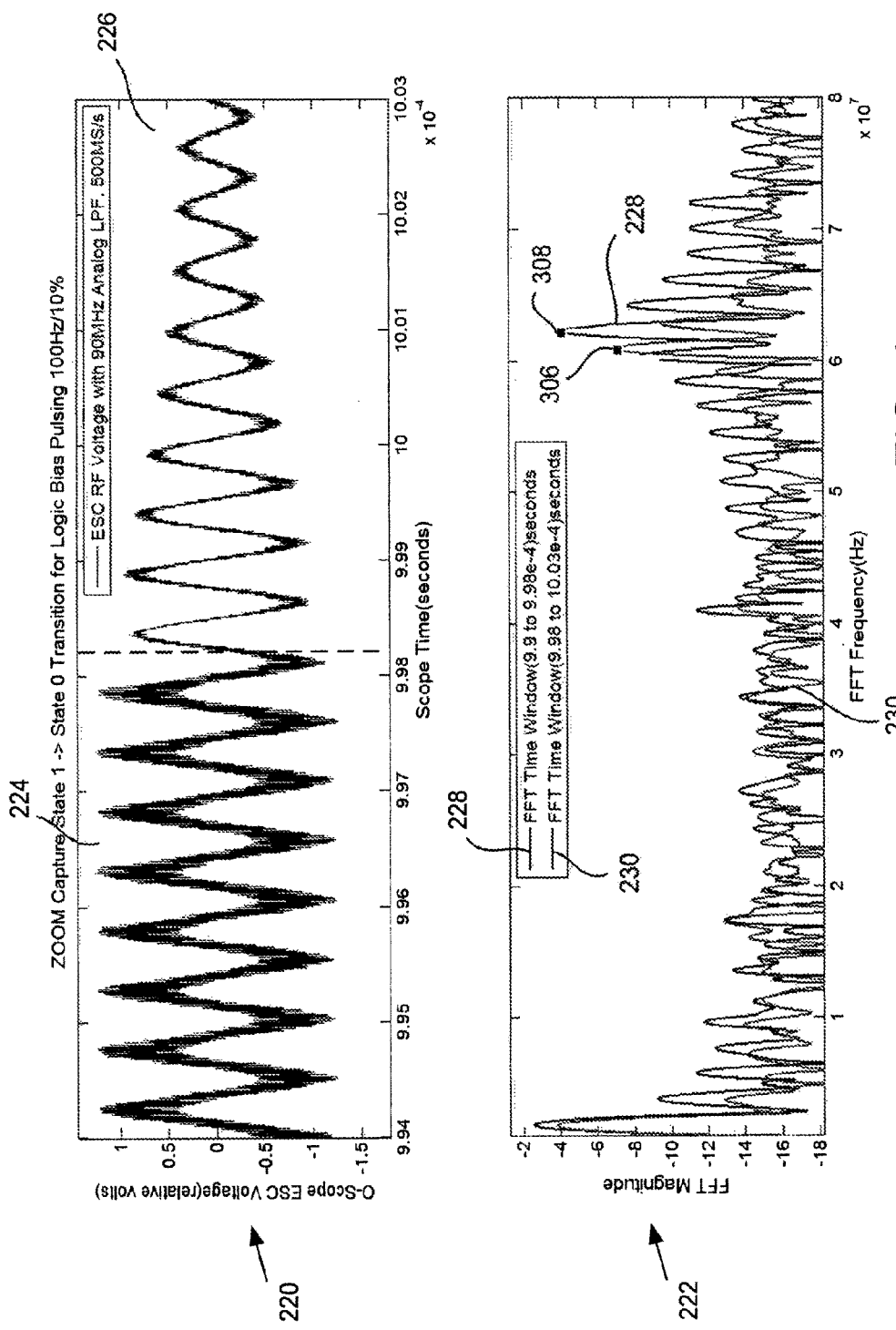
FIG. 4 shows embodiments of graphs to illustrate edge ramping of a 60 MHz signal, in accordance with an embodiment described in the present disclosure.

FIG. 4 shows embodiments of graphs 220 and 222 to illustrate edge ramping of the 60 MHz signal. Graph 220 plots voltage of signals versus time and graph 222 plots fast Fourier Transform (FFT) magnitude of an RF signal versus an FFT frequency. In a portion 224 of the graph 220, both the 2 MHz and 60 MHz signals are on. In a portion 226 of the graph 220, the 2 MHz signal is turned off and the 60 MHz signal is transitioning. Edge ramping is used to provide the 60 MHz signal to take more time to transition from the state S1 to the state S0 than that taken by the 2 MHz signal.

A plot 228 shows change in FFT magnitude of the 2 MHz signal and a plot 230 shows a change in FFT magnitude of the 60 MHz signal. During a transition period as illustrated by a difference between a peak 308 of the 2 MHz signal and a peak 306 of the 60 MHz signal, FFT magnitude of the 60 MHz signal is increased to perform edge ramping.

Figure 5:
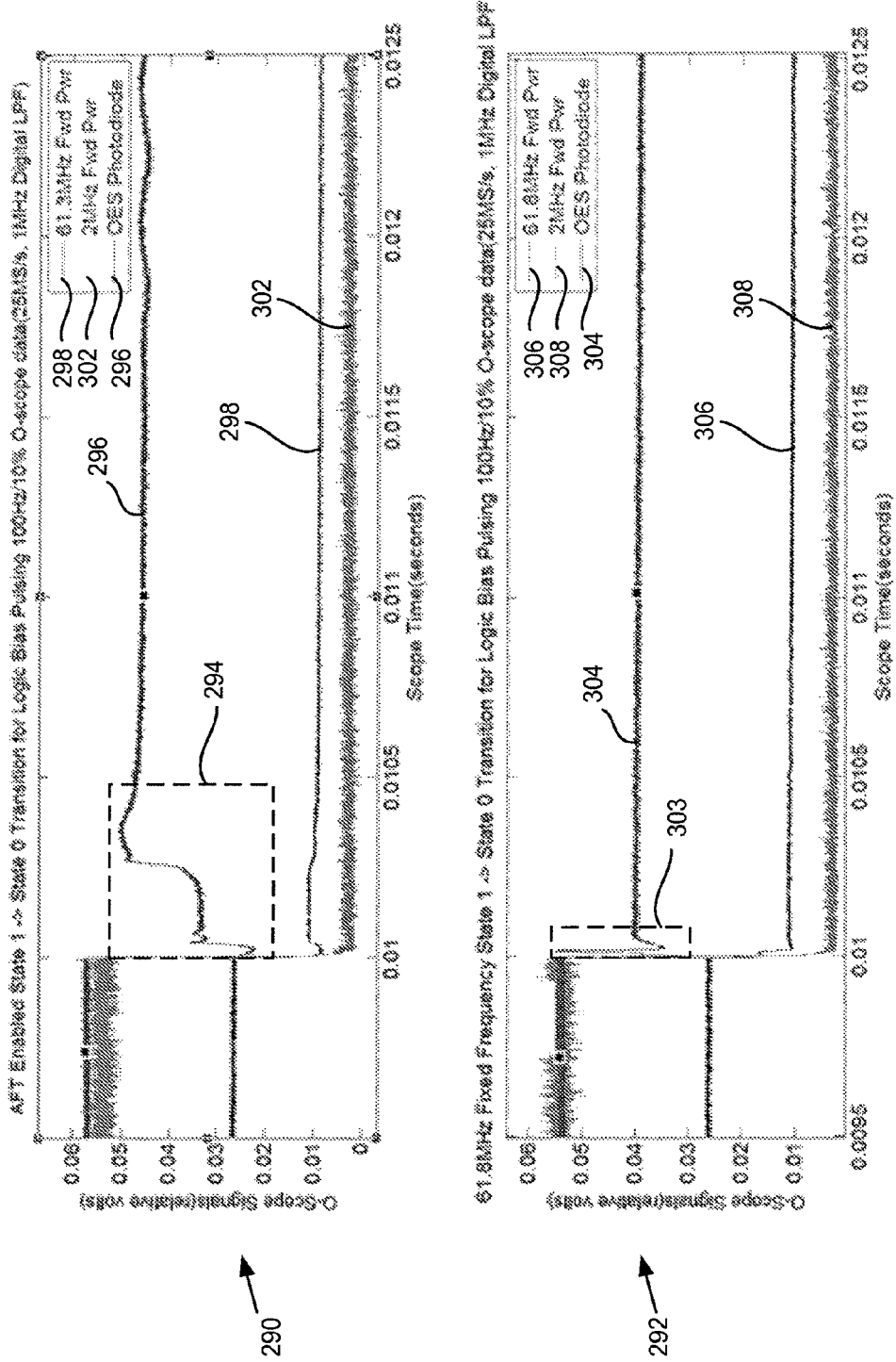
FIG. 5 shows graphs to illustrate a difference between an amount of time for plasma to stabilize when edge ramping is not applied and an amount of time for plasma to stabilize when edge ramping is applied, in accordance with an embodiment described in the present disclosure.

FIG. 5 shows graphs 290 and 292 to illustrate a difference between an amount of time for plasma to stabilize when edge ramping is not applied and an amount of time for plasma to stabilize when edge ramping is applied. Each graph 290 and 292 plots voltage as measured by an oscilloscope versus time. A plot 296 shows the voltage of plasma, a plot 298 shows a voltage of the 2 MHz signal, and a plot 302 shows a voltage of the 60 MHz signal. Moreover, a plot 304 shows the voltage of plasma, a plot 306 shows a voltage of the 2 MHz signal, and a plot 308 shows a voltage of the 60 MHz signal. As shown by portions 294 and 303, it takes more time for plasma to stabilize when edge ramping is not applied than that taken for plasma to stabilize when edge ramping is applied. Edge ramping is applied in the graph 292 and is not applied in the graph 290.

Figure 6:
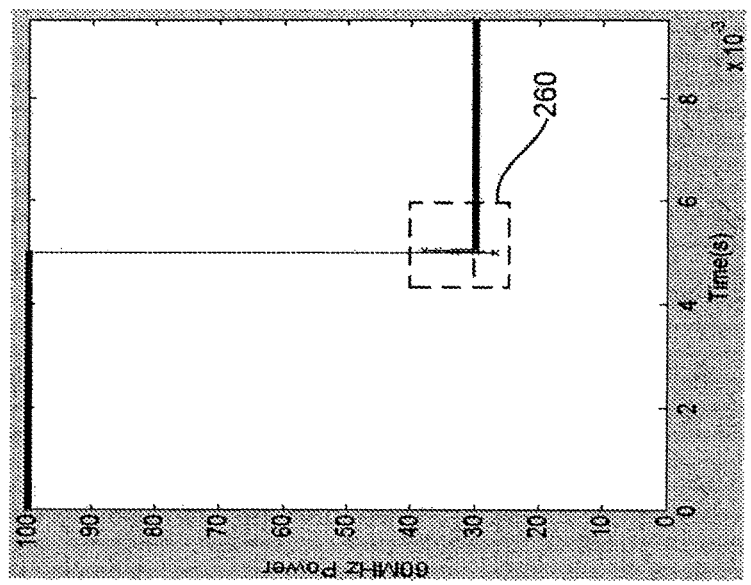
FIG. 6 shows graphs to illustrate a difference between forward power when edge ramping is not performed and forward power when edge ramping is performed, in accordance with an embodiment described in the present disclosure.
Figure 6:
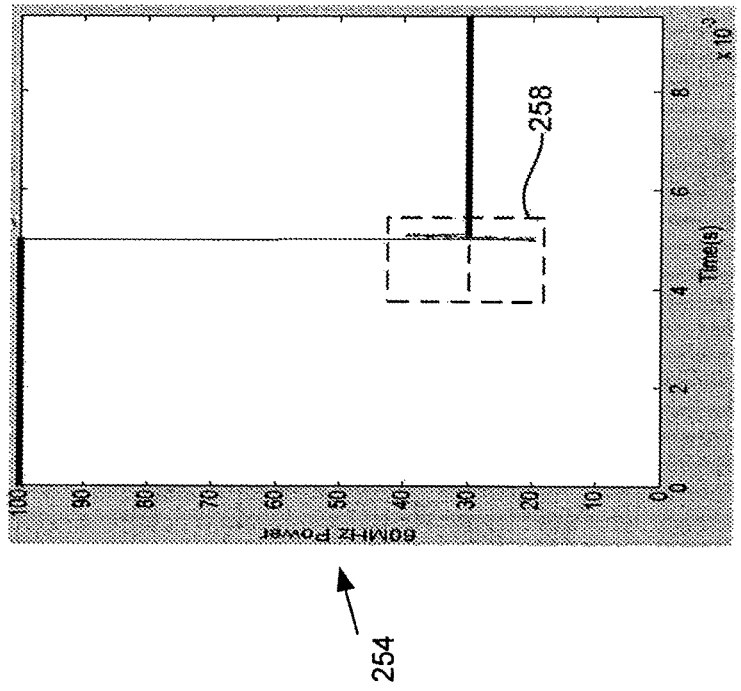

FIG. 6 shows graphs 254 and 256 to illustrate a difference between forward power when edge ramping is not performed and forward power when edge ramping is performed. Each graph 254 and 256 plots a forward power of the 60 MHz signal versus time. As shown in a portion 258 of the graph 254, there is a higher amount of ringing than that shown in a portion 260 of the graph 256. The graph 254 is generated without performance of edge ramping and the graph 256 is generated with performance of edge ramping.

Figure 7:
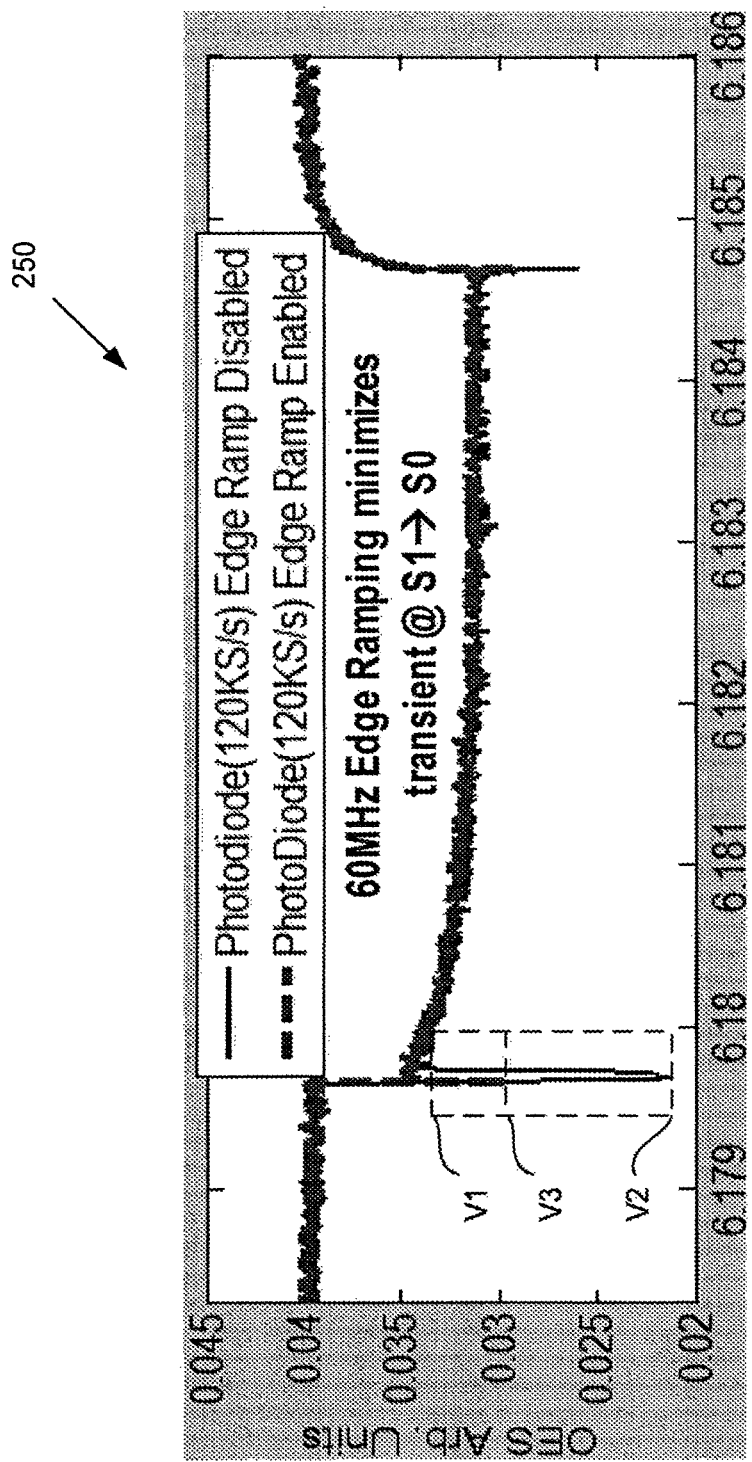
FIG. 7 shows a graph that illustrates an effect of edge ramping on a signal that is sensed by an optical emission spectroscope, in accordance with an embodiment described in the present disclosure.

FIG. 7 shows a graph 250 that illustrates an effect of edge ramping on a signal that is sensed by an optical emission spectroscope (OES). The graph 250 plots arbitrary units, e.g., power of plasma, voltage of plasma, etc. versus time. As shown, without edge ramping, the arbitrary units shoot from a value V1 to a value V2 and with edge ramping, the arbitrary units shoot from the value V1 to a value V3, which is less than the value V2. Accordingly, edge ramping results is a lesser disturbance in plasma than when edge ramping is not performed.

Figure 8:
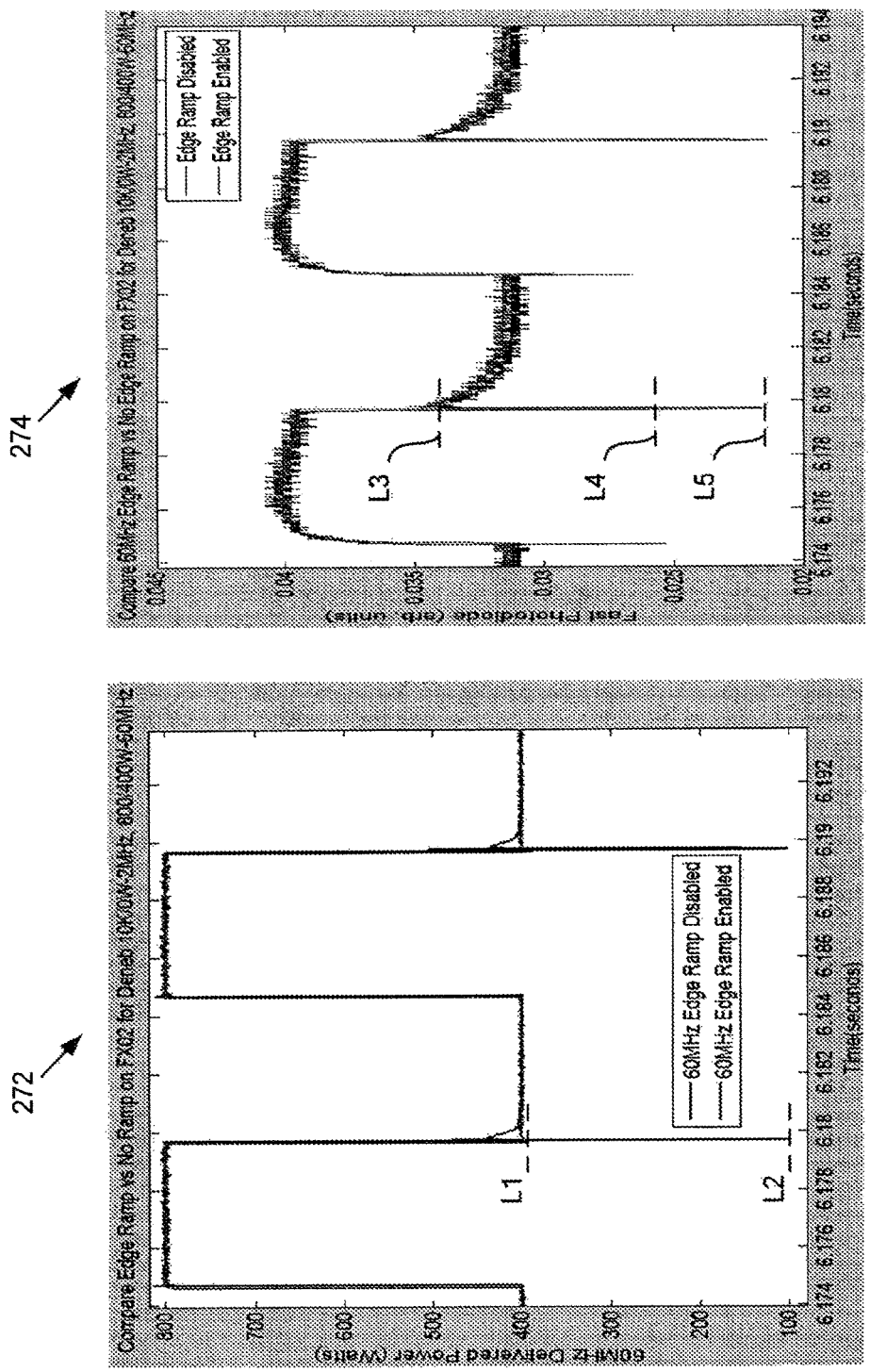
FIG. 8 shows a graph to illustrate a difference between forward power when edge ramping is not performed and forward power when edge ramping is performed and shows another graph to illustrate a difference between plasma impedance when edge ramping is performed and plasma impedance when edge ramping is not performed, in accordance with one embodiment described in the present disclosure.

FIG. 8 shows a graph 272 to illustrate a difference between forward power when edge ramping is not performed and forward power when edge ramping is performed and FIG. 8 shows another graph 274 to illustrate a difference between plasma impedance when edge ramping is performed and plasma impedance when edge ramping is not performed. The graph 272 plots a forward power of the 60 MHz signal versus time. The graph 274 plots arbitrary units, e.g., power of plasma, voltage of plasma, etc., versus time. When edge ramping is not performed, the 60 MHz signal shoots below a level L1 to a level L2 and when edge ramping is performed, the 60 MHz signal shoots to the level L1. Moreover, when edge ramping is not performed, the arbitrary units shoots from a level L3 to a level L5 and when edge ramping is performed, the arbitrary units shoot from the level L3 to a level L4, which is lower than the level L5 and results in lesser disturbance in plasma.

Figure 9:
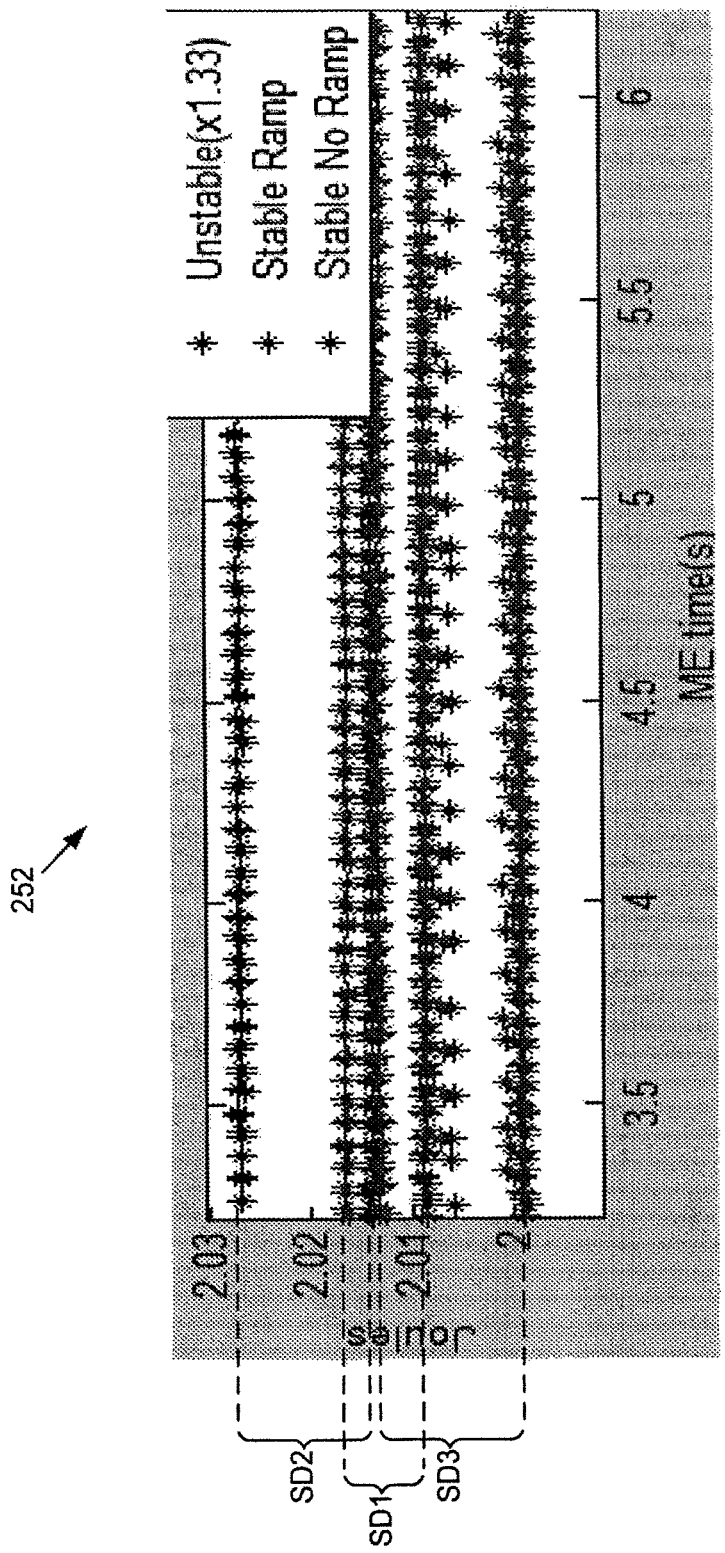
FIG. 9 shows a graph that plots energy in Joules of plasma versus time to illustrate a difference between standard deviation of the energy when edge ramping is performed and in standard deviation in the energy when edge ramping is not performed, in accordance with an embodiment described in the present disclosure.

FIG. 9 shows a graph 252 that plots energy in Joules of plasma versus time to illustrate a difference between standard deviation of the energy when edge ramping is performed and in standard deviation in the energy when edge ramping is not performed. As shown, a standard deviation SD1 in the energy when edge ramping is performed is lesser than a standard deviation SD2 in the energy when plasma is unstable and when no edge ramping is performed and lesser than a standard deviation SD3 in the energy when plasma is stable and when no edge ramping is performed.

Figure 10:
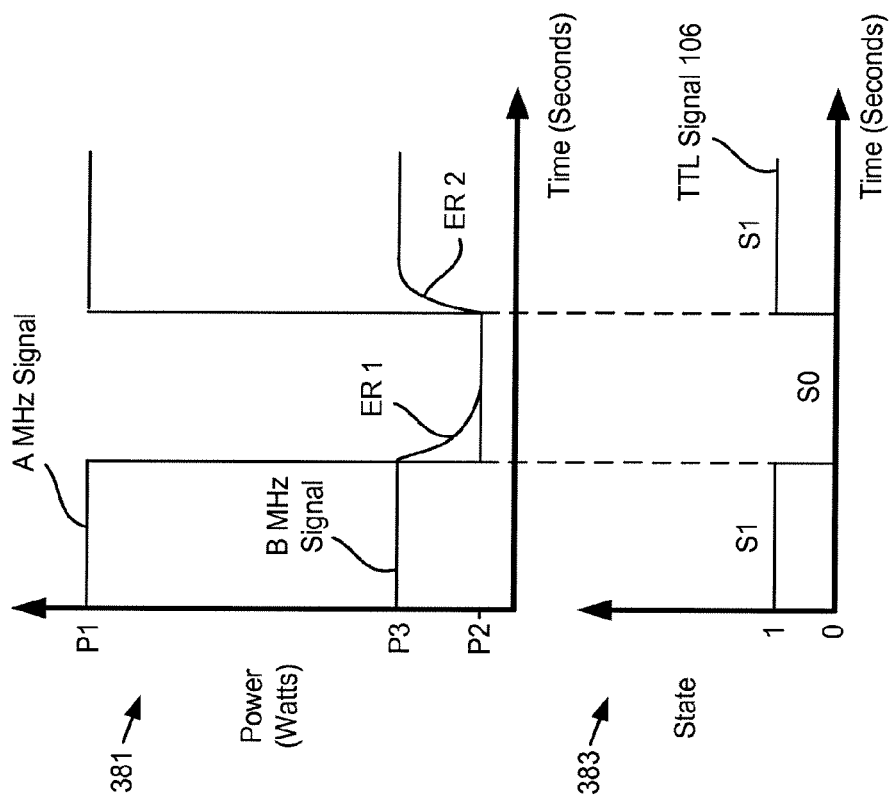
FIG. 10 shows graphs to illustrate an embodiment of edge ramping, in accordance with an embodiment described in the present disclosure.

FIG. 10 shows graphs 381 and 383 to illustrate an embodiment of edge ramping. The graph 381 plots forward power in watts versus time in seconds. The graph 383 plots a state of the TTL signal 106 versus time in seconds. As shown in FIG. 10, when the TTL signal 106 transitions from the state S1 to the state S0, an A MHz signal, e.g., a 2 MHz signal, a 27 MHz signal, etc., transitions from a high power input P1 to a low power input P2. As shown, a B MHz signal, e.g., a 27 MHz signal, a 60 MHz signal, etc., does not transition at the same rate as that of the rate of the transition of the A MHz signal from the high power input of P1 to the low power input of P2. The B MHz signal transitions at a slower rate than that of the rate of transition of the A MHz signal from the high power input of P1 to the low power input of P2. For example, the B MHz signal has a slope, which is not infinite, during the transition of the A MHz signal from the high power input of P1 to the low power input of P2. As another example, the B MHz signal has a negative slope during the transition of the A MHz signal from the high power input of P1 to the low power input of P2. In one embodiment, the A MHz signal has an infinite slope during the transition from the power input P1 to the power input P2. Examples of the slope of the B MHz signal include a slope of 1, a curved slope, a slope that is changing etc., during the transition of the A MHz signal from the high power input of P1 to the low power input of P2. The B MHz signal transitions from a high power input P3 to the low power input P2. During the transition of the B MHz signal, the B MHz signal has an edge ramp ER1. The edge ramp ER1 is generated by controlling power and/or frequency of the B MHz signal during the transition from the high power input P3 to the low power input P2.

Similarly, when the TTL signal 106 transitions from the state S0 to the state S1, the A MHz signal transitions from the low power input P2 to the high power input P1. As shown, the B MHz signal does not transition at the same rate as that of the rate of the transition of the A MHz signal from the low power input of P2 to the high power input of P1. The B MHz signal transitions at a slower rate than that of the rate of transition of the A MHz signal from the low power input of P2 to the high power input of P1. For example, the B MHz signal has a slope, which is not infinite, during the transition of the A MHz signal from the low power input of P2 to the high power input of P1. As another example, the B MHz signal has a positive slope during the transition of the A MHz signal from the low power input of P2 to the high power input of P1. In one embodiment, the A MHz signal has an infinite slope during the transition from the power input P2 to the power input P1. Examples of the slope of the B MHz signal include a slope of 1, a curved slope, a slope that is changing, etc., during the transition of the A MHz signal from the low power input of P2 to the high power input of P1. The B MHz signal transitions from the low power input P2 to the high power input of P3. During the transition of the B MHz signal, the B MHz signal has an edge ramp ER2. The edge ramp ER2 is generated by controlling power and/or frequency of the B MHz signal during the transition from the low power input P2 to the high power input P3.

In one embodiment, the B MHz signal transitions from the power input P3 to a low power input, which is other than the low power input P2. In an embodiment, the B MHz signal transitions from the power input P3 to a high power input that is higher than the power input P3 when the A MHz signal transitions from the high power input of P1 to the low power input of P2 and the B MHz signal transitions from the high power input to the power input P3 when the A MHz signal transitions from the low power input of P2 to the high power input of P1.

It should be noted that when the A MHz signal is at the power input P1, the A MHz signal is in one state and when the A MHz signal is at the power input P2, the A MHz signal is in another state. Similarly, when the B MHz signal is at the power input P3, the B MHz signal is in one state and when the B MHz signal is at the power input P2, the B MHz signal is in another state.

Figure 11:
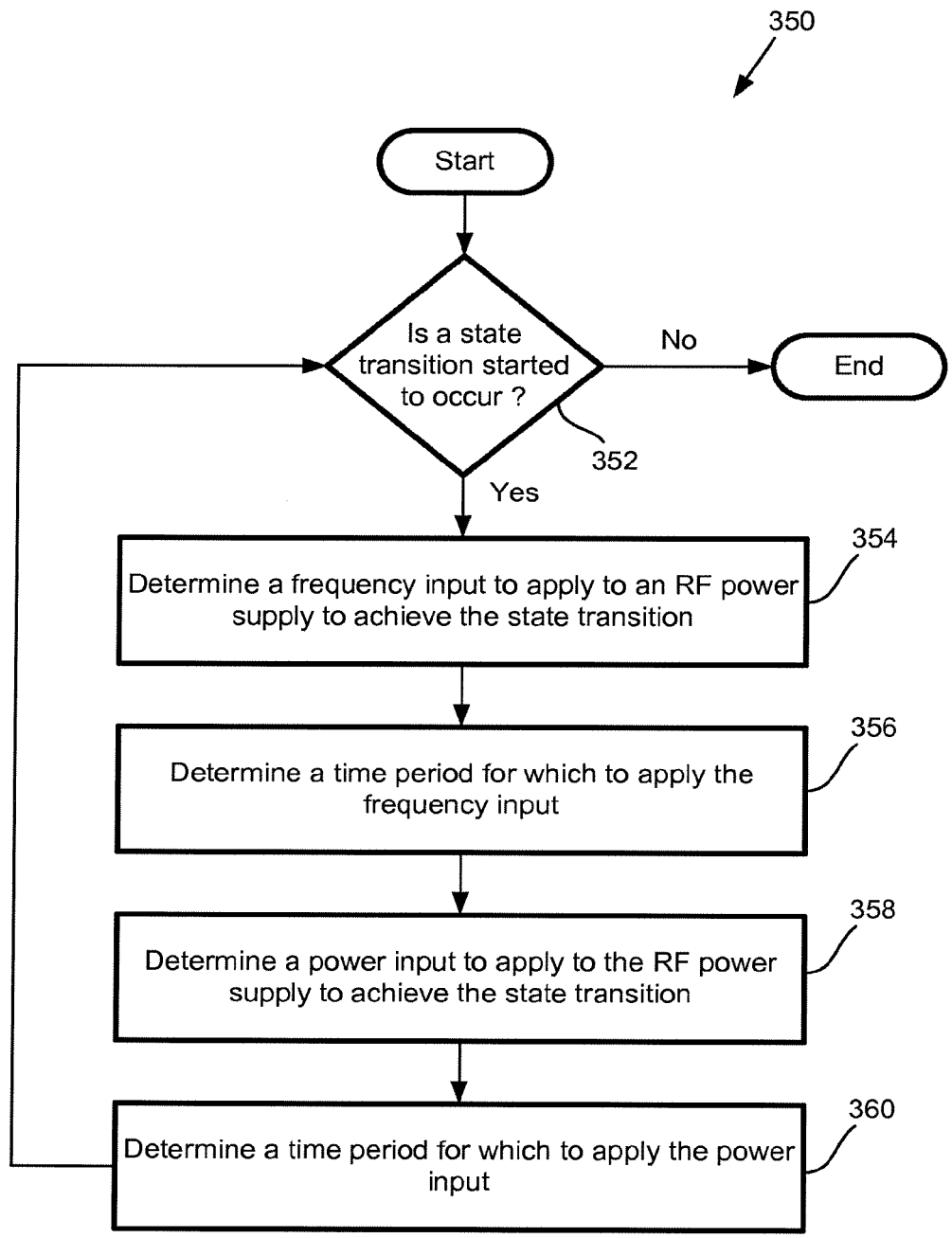
FIG. 11 is a flowchart of an embodiment of a method for edge ramping an RF signal, in accordance with one embodiment described in the present disclosure.

FIG. 11 is a flowchart of an embodiment of a method 350 for edge ramping an RF signal. The method 350 is executed by the DSP 160 (FIG. 1) or the DSP 118 (FIG. 2). In one embodiment, the method 350 is executed by an AFT or a power controller, or a combination thereof. For example, the method 350 is executed by the controller 168, 170, the AFT 120, the AFT 122, the power controller 140, the power controller 142, or a combination thereof (FIGS. 1 and 2).

In an operation 352, it is determined whether a state transition has started to occur. For example, it is determined whether the TTL signal 106 is transitioning from the state S1 to the state S0 or from the state S0 to the state S1. In response to determining that the state transition has not started to occur, the method 350 ends.

On the other hand, in response to determining that the state transition has started to occur, in an operation 354, a frequency input to apply to an RF DAS to achieve the state transition is determined. For example, upon determining that the state transition has started to occur from the state S1 to the state S0 of the TTL signal 106, the one or more frequency values FT_S1-S0 are obtained from a memory device. As another example, upon determining that the state transition has started to occur from the state S0 to the state S1, one or more frequency values FT_S0-S1 are obtained from a memory device.

In an operation 356, a time period for which to apply the frequency input is determined. For example, the time period is greater than a time period for the RF signal generated by the DAS 116 of the x MHz generator to transition from the high power value to the low power value and is less than a duty cycle, e.g., 50%, etc., of the TTL signal 106. In this example, if the duty cycle of the TTL signal 106 is 70%, the time period during which the frequency input is applied is greater than a time period for the RF signal generated by the DAS 116 to transition from the high power value to the low power value and is less than the remaining duty cycle of 30%. As another example, the time period during which the frequency input is applied is greater than a time period for the RF signal generated by the DAS 116 to transition from the high power value to the low power value and is less than an amount of time for the plasma impedance of plasma within plasma chamber 124 to stabilize during the state S0. As yet another example, the time period during which the frequency input is applied is greater than a time period for the RF signal generated by the DAS 116 to transition from the high power value to the low power value and is less than an amount of time for the impedance matching circuit 150 to match impedance of one or all portions, e.g., the DAS 114, the AFT 108, the AFT 110, the power controller 136, the power controller 138, etc., of the x MHz generator 102 with impedance of one or more portions of the plasma chamber 124.

Moreover, in an operation 358, a power input to apply to an RF DAS to achieve the state transition is determined. For example, upon determining that the state transition has started to occur from the state S1 to the state S0 of the TTL signal 106, the one or more power values PT_S1-S0 are obtained from a memory device. As another example, upon determining that the state transition has started to occur from the state S0 to the state S1, one or more power values PT_S0-S1 are obtained from a memory device.

In an operation 360, a time period for which to apply the power input is determined. For example, the time period is greater than a time period for the RF signal generated by the DAS 116 to transition from the high power value to the low power value and is less than a duty cycle, e.g., 50%, etc., of the TTL signal 106. In this example, if the duty cycle of the TTL signal 106 is 60%, the time period during which the power input is applied is greater than a time period for the RF signal generated by the DAS 116 to transition from the high power value to the low power value and is less than the remaining duty cycle of 40%. As another example, the time period during which the power input is applied is greater than a time period for the RF signal generated by the DAS 116 to transition from the high power value to the low power value and is less than an amount of time for the plasma impedance of plasma within plasma chamber 124 to stabilize during the state S0. As yet another example, the time period during which the power input is applied is greater than a time period for the RF signal generated by the DAS 116 to transition from the high power value to the low power value and is less than an amount of time for the impedance matching circuit 150 to match impedance of one or more portions, e.g., the DAS 114, the AFT 120, the AFT 122, the power controller 140, the power controller 142, etc., of the y MHz generator 112, with impedance of one or more portions of the plasma chamber 124.

In an embodiment, both the frequency input and the power input are applied simultaneously or substantially at the same time during a time period.

It should be noted that although the above-described embodiments relate to providing the 2 MHz RF signal and/or 60 MHz signal and/or 27 MHz signal to the lower electrode 130 and grounding the upper electrode 126, in several embodiments, the 2 MHz, 60 MHz, and 27 MHz signals are provided to the upper electrode 126 while the lower electrode 130 is grounded.

It is also noted that in one embodiment, an input, e.g., frequency input, power input, etc., or a level, e.g., power level, frequency level, includes one or more values that are within a threshold of another value. For example, a power level includes the power value P21 and other power values that are within the threshold of the power value P21. In this example, the power level excludes any power values for another state, e.g., power value P20 for state S0. As another example, a frequency input includes the frequency value F11 and other frequency values that are within the threshold of the frequency value F11. In this example, the frequency input excludes any frequency values for another state, e.g., frequency value F10 for state S0.

It is noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the 2 MHz and the 60 MHz power supplies are coupled to an inductor within the ICP plasma chamber.

Moreover, in one embodiment, the terms DAS and driver and amplifier are used interchangeably herein.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
generating a first radio frequency (RF) signal, wherein the first RF signal transitions from one state to another, the transition from the one state to the other state of the first RF signal resulting in a change in plasma impedance;
generating a second RF signal, wherein the second RF signal transitions from one state to another to stabilize the change in the plasma impedance;
providing parameter values for performing edge ramping of the second RF signal when the second RF signal transitions from the one state to the other state, wherein the edge ramping of the second RF signal is performed to modify a rate of the transition of the second RF signal to be different than a rate of the transition of the first RF signal.

2. The method of claim 1, wherein the edge ramping has a positive slope or a negative slope.

3. The method of claim 1, wherein the parameter values include frequency values or power values.

4. The method of claim 1, wherein the one state of the first RF signal is an on state and the other state of the first RF signal is an off state, wherein the one state of the second RF signal is an on state and the other state of the second RF signal is an off state.

5. The method of claim 1, wherein the rate of the transition of the second RF signal is less than the rate of the transition of the first RF signal.

6. The method of claim 1, wherein the transition from the one state of the first RF signal to the other state of the first RF signal has a greater slope than the transition from the one state of the second RF signal to the other state of the second RF signal.

7. A method for reducing an effect of a change in power level of a radio frequency (RF) signal on plasma impedance, comprising:
identifying states of a digital pulsed signal, the states including a first state and a second state;
identifying a first primary power input corresponding to the first state;
identifying a second primary power input corresponding to the second state;
tuning a primary RF signal to achieve the first primary power input when the digital pulsed signal is in the first state;
tuning the primary RF signal to achieve the second primary power input when the digital pulsed signal is in the second state,
the primary RF signal having a primary rate of transition from the first primary power input to the second primary power input;
identifying a first secondary power input corresponding to the first state;
identifying a second secondary power input corresponding to the second state;
tuning a secondary RF signal to achieve the first secondary power input when the digital pulsed signal is in the first state;
tuning the secondary RF signal to achieve the second secondary power input when the digital pulsed signal is in the second state; and
determining a secondary rate of transition from the first secondary power input to the second secondary power input, wherein the secondary rate of transition is different than the primary rate of transition.

8. The method of claim 7, wherein the secondary rate of transition is less than the primary rate of transition.

9. The method of claim 7, wherein a first amount of time taken to transition from the first secondary power input to the second secondary power input is greater than a second amount of time taken to transition from the first primary power input to the second primary power input.

10. The method of claim 9, wherein the first amount of time is less than a third amount of time for plasma impedance to stabilize.

11. The method of claim 9, wherein the first amount of time is less than a third amount of time for an impedance matching circuit to match impedance of one or more portions of an RF generator with an impedance of one or more portions of a plasma chamber.

12. The method of claim 7, wherein the first state is a high state and the second state is a low state.

13. The method of claim 7, wherein the first state is an on state and the second state is an off state.

14. A method for reducing an effect of a change in power level of a radio frequency (RF) signal on plasma impedance, comprising:
generating a primary RF signal;
identifying states of a digital pulsed signal, the states including a first state and a second state;
tuning the primary RF signal to achieve plasma impedance corresponding to a first primary power input when the digital pulsed signal is in the first state;
tuning the primary RF signal to achieve plasma impedance corresponding to a second primary power input when the digital pulsed signal is in the second state, the primary RF signal having a primary rate of transition from the first primary power input to the second primary power input;
generating a secondary RF signal;
tuning the secondary RF signal to achieve plasma impedance corresponding to a first secondary power input when the digital pulsed signal is in the first state;
tuning the secondary RF signal to achieve plasma impedance corresponding to a second secondary power input when the digital pulsed signal is in the second state; and
determining a secondary rate of transition from the first secondary power input to the second secondary power input, wherein the secondary rate of transition is different than the primary rate of transition.

15. The method of claim 14, wherein the secondary rate of transition is less than the primary rate of transition.

16. The method of claim 14, wherein a first amount of time taken to transition from the first secondary power input to the second secondary power input is greater than a second amount of time taken to transition from the first primary power input to the second primary power input.

17. The method of claim 16, wherein the first amount of time is less than a third amount of time for impedance of plasma to stabilize in the second state.

18. The method of claim 16, wherein the first amount of time is less than a third amount of time for an impedance matching circuit to match impedance of one or more portions of an RF generator with impedance of one or more portions of a plasma chamber.

19. The method of claim 14, wherein the first state is a high state and the second state is a low state.

20. The method of claim 14, wherein the first state is an on state and the second state is an off state.

* * * * *